United States Patent
Brenden

(10) Patent No.: US 8,611,385 B2
(45) Date of Patent: Dec. 17, 2013

(54) OPTICAL SOURCE DRIVER CIRCUIT WITH CONTROLLABLE TERMINATION

(75) Inventor: Jason P. Brenden, Woodbury, MN (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/474,068

(22) Filed: May 17, 2012

(65) Prior Publication Data

US 2013/0308431 A1    Nov. 21, 2013

(51) Int. Cl.
*H01S 3/00* (2006.01)
(52) U.S. Cl.
USPC .................................... 372/38.02; 372/38.07
(58) Field of Classification Search
USPC ............................................ 372/38.02, 38.07
See application file for complete search history.

(56) References Cited

U.S. PATENT DOCUMENTS

| | | |
|---|---|---|
| 5,598,467 A | 1/1997 | Bremner et al. |
| 7,483,459 B2 | 1/2009 | Uesaka et al. |
| 7,948,262 B2 | 5/2011 | Nguyen |
| 2001/0046242 A1* | 11/2001 | Kawakami et al. ........ 372/38.02 |
| 2004/0258115 A1* | 12/2004 | Murata et al. .............. 372/38.02 |
| 2007/0098026 A1* | 5/2007 | Uesaka et al. ............. 372/29.01 |

* cited by examiner

*Primary Examiner* — Kinam Park
(74) *Attorney, Agent, or Firm* — Ryan, Mason & Lewis, LLP

(57) ABSTRACT

A driver circuit for a laser diode or other optical source comprises a controllable termination for a transmission line coupled between the driver circuit and the optical source, with the controllable termination being switchable between at least first and second termination configurations. The transmission line comprises a first conductor coupled to a first terminal of the optical source and a second conductor coupled to a second terminal of the optical source, and the driver circuit comprises a first current source configured to drive the first conductor, and a second current source configured to drive the second conductor. By way of example, the first termination configuration may comprise an alternating current (AC) termination configuration and the second termination configuration may comprise a direct current (DC) termination configuration.

22 Claims, 3 Drawing Sheets

OPTICAL SOURCE DRIVER CIRCUIT WITH CONTROLLABLE TERMINATION

BACKGROUND

Optical sources are in widespread use for data storage and communication applications, and include lasers of many different types and configurations. By way of example, such lasers may be implemented using one or more laser diodes each having an associated laser driver circuit.

Lasers are utilized in a wide variety of optical disk recording and playback systems. Standardized optical disk storage formats have recently evolved from Digital Versatile Disk (DVD) to Blu-ray. A Blu-ray disk is read using a blue laser having a wavelength of 405 nanometers, significantly shorter than the 650 nanometer red laser used to read DVDs. Information can therefore be stored at a much higher density on Blu-ray disks. For example, a single layer Blu-ray disk can store about 25 Gigabytes (GB) of data, compared to about 5 GB for a DVD. Higher storage densities can be achieved by configuring the optical disk to include multiple storage layers, as is well known.

In addition, three-dimensional (3D) image information for movies or other types of content can be stored on Blu-ray disks and other optical disks. A 3D optical disk playback device can read such information from the optical disk and provide a corresponding 3D image signal output for presentation on a television or other display device, thereby providing a 3D viewing experience to its users.

Lasers are also commonly utilized in other types of recording applications, including magnetic recording systems. For example, a magnetic recording technique known as heat-assisted magnetic recording (HAMR) utilizes a laser to locally preheat an area on the surface of a magnetic storage disk prior to performing magnetic recording in that area. This facilitates the magnetic recording process, thereby allowing data to be stored in a higher density than would otherwise be possible.

There are numerous other types of systems that utilize lasers outside of the recording or playback context, including optical communication systems. In such communication systems, for example, lasers may be used to generate modulated optical signals for transmission over optical fiber.

In systems of the type described above, a laser driver circuit may be utilized to drive current to a laser diode in order to allow the laser diode to turn on so as to provide light output. The laser diode typically needs to be transitioned rapidly between its on and off states in order to support the high data rates often utilized for recording, playback or communication applications. The driver circuit is coupled to the laser diode via one or more transmission lines. It is particularly important at high data rates that these transmission lines coupling the driver circuit to the laser diode be terminated in an appropriate manner, so as to reduce any signal loss or other degradations that may be induced by reflections or standing waves resulting from impedance mismatch.

SUMMARY

Illustrative embodiments of the invention provide optical source driver circuits that include controllable terminations. Such a driver circuit may be used, for example, to drive a laser diode via one or more transmission lines.

In one embodiment, a driver circuit for a laser diode or other optical source comprises a controllable termination for a transmission line coupled between the driver circuit and the optical source, with the controllable termination being switchable between at least first and second termination configurations. The transmission line comprises a first conductor coupled to a first terminal of the optical source and a second conductor coupled to a second terminal of the optical source, and the driver circuit comprises a first current source configured to drive the first conductor, and a second current source configured to drive the second conductor.

By way of example, the first termination configuration may comprise an alternating current (AC) termination configuration and the second termination configuration may comprise a direct current (DC) termination configuration.

As a more particular example, the controllable termination in one or more of the illustrative embodiments comprises a first buffer circuit having an output coupled via a first matching resistor to a first conductor of the transmission line and a second buffer circuit having an output coupled via a second matching resistor to a second conductor of the transmission line. In an arrangement of this type, the controllable termination may be configured such that, in the first termination configuration, an input of the first buffer circuit is coupled to a feedback resistor and decoupled from a first termination voltage source, and in the second termination configuration, the input of the first buffer circuit is decoupled from the feedback resistor and coupled to the first termination voltage source, while an input of the second buffer circuit is coupled to a second termination voltage source in both the first and second termination configurations.

Illustrative embodiments of the invention may be implemented in the form of an optical disk recording and playback system, a magnetic recording system such as a HAMR system, an optical communication system, or any other type of system that comprises one or more driver circuits for driving respective laser diodes or other types of optical sources.

DETAILED DESCRIPTION

Embodiments of the invention will be illustrated herein in conjunction with an exemplary optical disk recording and playback system that incorporates a laser comprising a laser driver circuit with a controllable termination. It should be understood, however, that embodiments of the invention are not limited to the particular systems, lasers, circuitry, controllable terminations and associated techniques shown and described. The disclosed arrangements are more generally applicable to any system that comprises one or more lasers or other optical sources, and may be implemented using components other than those specifically shown and described in conjunction with the illustrative embodiments. For example, another embodiment of the invention may comprise a magnetic recording system in which a laser or other optical source is utilized to preheat a magnetic recording medium in order to facilitate subsequent magnetic recording, or an optical communication system in which one or more lasers or other optical sources are utilized to generate modulated optical signals for transmission over optical fiber.

Figure 1:
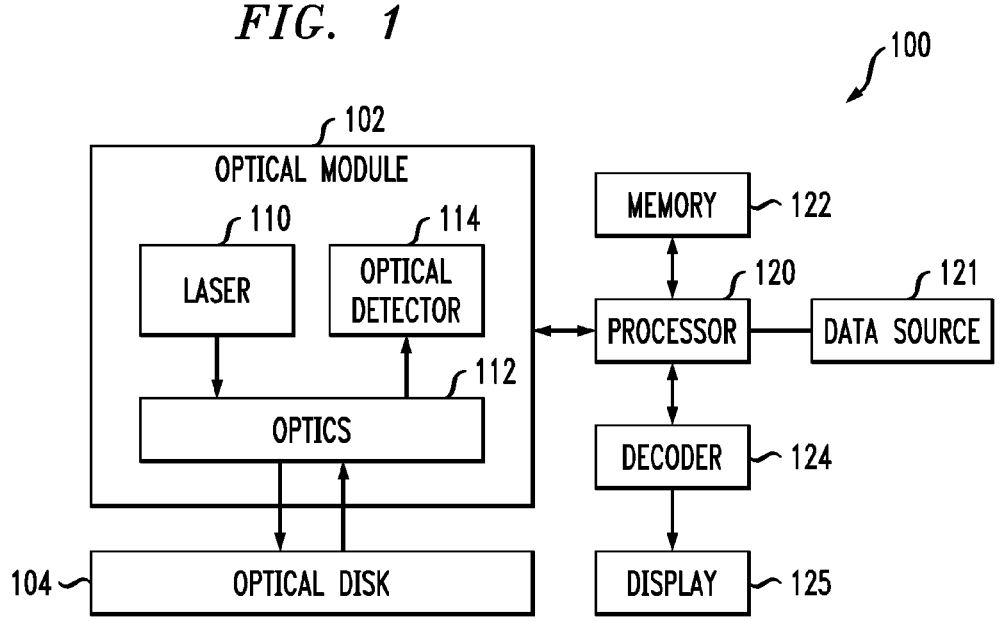
FIG. 1 is a block diagram of an optical disk recording and playback system that incorporates a laser comprising a driver circuit with a controllable termination in an illustrative embodiment of the invention.

FIG. 1 shows an optical disk recording and playback system 100 in accordance with an illustrative embodiment of the invention. The recording and playback system 100 in this embodiment more specifically comprises an optical module 102 that writes information to an optical disk 104 in a write mode of operation and reads information from the optical disk 104 in a read mode of operation. The optical disk 104 is therefore assumed to be a recordable optical disk, although numerous other types of optical disks, or more generally storage media, may be used in other embodiments. An "optical module" as the term is broadly utilized herein is not restricted to include only optical components, and will also generally include, for example, electrical components such as laser driver circuitry.

In a typical configuration, the optical disk 104 is inserted in a disk drive which controls the rotation of the disk as well as the positioning of laser light from the optical module 102 relative to grooves of the disk. The drive mechanisms and associated electronics for controlling rotation of the optical disk 104 and positioning of the optical module 102 are omitted from the figure for clarity and simplicity of illustration, but may be assumed to be implemented in a conventional manner.

The optical module 102 in the present embodiment comprises a laser 110, optics 112 and an optical detector 114. It will therefore be assumed without limitation that there is a single laser and associated optical detector in the present embodiment, although other numbers of lasers and detectors can be used in other embodiments. Also, these or other similar components need not be part of a single module, but could instead be implemented using separate modules in other embodiments.

The laser 110 may have a wavelength particularly adapted for writing or reading information on a particular type of optical disk, such as a Blu-ray or DVD optical disk, each of which may be configured to store 2D or 3D information. Multiple layer optical disks of these and other formats may also be used.

As a more particular example, the laser 110 may comprise a blue laser having a wavelength of approximately 400 nanometers suitable for reading stored information from a Blu-ray optical disk, or a red laser having a wavelength of approximately 650 nanometers suitable for reading stored information from a DVD optical disk. As indicated previously, other embodiments may utilize a combination of two or more lasers, and such lasers may have distinct wavelengths.

It may also be assumed in one or more of the illustrative embodiments that the optical disk 104 is a conventional 2D optical disk, such as a 2D Blu-ray optical disk or a 2D DVD optical disk, where the disk stores 2D image information but is not otherwise specially configured in any way for 3D playback. Alternatively, the optical disk 104 may comprise a 3D optical disk.

The optics 112 may be viewed as an example of what is more generally referred to herein as an "optical assembly." The term "optical assembly" as used herein is intended to be broadly construed, and may comprise any arrangement of optical elements used to direct light to and from the optical disk 104, and may also include associated structural, mechanical or electrical elements. For example, an optical assembly may comprise separate sets of optics associated with each of multiple lasers, or may utilize at least a subset of its optical elements to process light from multiple lasers. As another example, an optical assembly as the term is broadly used herein may be configured to generate multiple incident light beams from the output of a single laser. It should therefore be appreciated that embodiments of the invention do not require any particular arrangement of optics for directing light to and from the optical disk.

The optical module 102 is coupled to a processor 120 which controls the operation of the optical module and processes signals supplied by and delivered to that unit. The processor 120 may comprise, by way of example, a microprocessor, a digital signal processor (DSP), an application-specific integrated circuit (ASIC), a field-programmable gate array (FPGA), or other integrated circuit device, as well as portions or combinations of such devices. The processor 120 may be viewed as an example of what is more generally referred to herein as "controller circuitry." Such controller circuitry, although shown as separate from the optical module 102 in the present embodiment, may be implemented at least in part within the optical module in other embodiments. As the term is used herein, "controller circuitry" may therefore encompass, again by way of illustrative example and without limitation, disk drive electronics, signal processing electronics, and associated processing and memory circuitry, as well as one or more related electromechanical elements utilized to control positioning of the optical module 102 relative to the surface of the optical disk 104.

The controller circuitry as described above is assumed to be coupled to an input of the laser 110 and to provide an input data signal thereto from data source 121 for recording on the optical disk 104. The data source 121 is illustratively shown as being coupled to optical module 102 via the processor 120, but other types of data source connections may be used in other embodiments.

The controller circuitry as described above is also assumed to be coupled to an output of the optical detector 114 and to receive a detected signal therefrom for further processing associated with optical disk playback, and may additionally be coupled to other elements of the optical module, such as a control input of a controllable termination associated with a driver circuit of the laser 110.

Also associated with the processor 120 in the optical disk recording and playback system 100 is memory 122 and decoder 124. The memory 122 stores executable code that may be executed by processor 120 in implementing at least a portion of the recording and playback functionality of the optical disk recording and playback system 100, such as selection of one of a number of available termination configurations for a controllable termination of a driver circuit of laser 110. The memory 122 may comprise electronic memory such as random access memory (RAM) or read-only memory (ROM), in any combination, and is an example of what is more generally referred to herein as a "computer-readable storage medium."

The decoder 124 may comprise, for example, a DVD or Blu-ray decoder in embodiments designed to support playback of respective DVD and Blu-ray optical disks. Alternatively, separate DVD and Blu-ray decoders in an embodiment designed to support playback of both DVD and Blu-ray optical disks. Such decoders may be configured to provide, for example, H.264, MPEG-2 and/or MPEG-4 decoding functionality, or other types of decoding functionality, as required to support one or more particular video coding formats in a given embodiment. In other embodiments, a single decoder may be used to support multiple optical disk formats.

An information signal read out from the optical disk 104 is processed by decoder 124 to generate a video signal or other image signal suitable for presentation on display device 125. The display device may comprise, for example, a television, computer, mobile telephone, or any other processing device having an ability to display video or other information read out from the optical disk 104 via the optical module 102.

The optical detector 114 may comprise a single photodetector array, although other embodiments may utilize multiple photodetector arrays and possibly additional associated circuitry, for generating one or more data streams using laser light reflected from the optical disk. Accordingly, a given optical detector may comprise additional electronic circuitry, such as level-shifting circuitry, conversion circuitry, or other types of circuitry, that is coupled to or incorporated into a photodetector array. Such circuitry is intended to be encompassed by the general term "optical detector" as used herein.

The optics 112 in this embodiment more specifically comprise optical elements which are arranged for directing light from the laser 110 to the optical disk 104 and from the optical disk 104 to the optical detector 114. For example, in the read mode of operation, the optics 112 direct the incident light from the laser 110 to form a scanning spot on the optical disk, and direct the corresponding reflected light from the scanning spot to the optical detector 114. The optics are also utilized to direct modulated incident light from the laser 110 so as to write data from the data source 121 to the optical disk in a write mode of operation. In other embodiments, separate read and write lasers with respective separate sets of optics may be used to support respective read and write modes of operation.

The system elements 102, 120, 122 and 124 may comprise elements of an otherwise conventional optical disk recording and playback device, such as a Blu-ray recorder and player that is also backwards compatible with the DVD format. One or more such elements may be implemented in a processing device such as the television, computer, mobile telephone, or other processing device that provides the display device 125. The data source 121 is assumed to be part of the system 100 in this embodiment, but in other embodiment may be arranged at least in part externally to system 100.

System elements such as laser 110, optical detector 114, processor 120, data source 121, memory 122 and decoder 124 may be implemented at least in part in the form of one or more integrated circuits, such as an otherwise conventional system-on-chip (SOC) integrated circuit designed for use in an optical disk recording and playback system and suitably modified to support optical disk recording and playback functionality as disclosed herein. Thus, for example, driver circuitry of the laser 110, and an associated controllable termination, may be implemented in the form of an integrated circuit.

In an integrated circuit implementation, multiple integrated circuit dies are typically formed in a repeated pattern on a surface of a wafer. Each such die may include a device as described herein, including at least one driver circuit having at least one controllable termination, and may include other structures or circuits. The dies are cut or diced from the wafer, then packaged as integrated circuits. One skilled in the art would know how to dice wafers and package dies to produce packaged integrated circuits. Integrated circuits so manufactured are considered embodiments of this invention.

The optical disk playback system 100 as illustrated in FIG. 1 may include other elements in addition to or in place of those specifically shown, including one or more elements of a type commonly found in a conventional implementation of such a system. These and other conventional elements, being well understood by those skilled in the art, are not described in detail herein. It should therefore be understood that the particular arrangement of elements shown in FIG. 1 is presented by way of illustrative example only. Accordingly, those skilled in the art will recognize that a wide variety of other optical disk recording and playback system configurations may be used in implementing the invention.

For example, as noted above, alternative embodiments of the invention may include multiple lasers, and corresponding optics and optical detectors, and may also include systems that perform only recording or only playback.

Also, as indicated previously, other embodiments can include any type of system that incorporates one or more lasers, such as magnetic recording systems that utilize lasers to perform localized heating of the magnetic recording medium prior to recording, and optical communication systems. Optical and magnetic disk systems of the type described above are examples of what are more generally referred to herein as disk-based storage systems, and such systems may be configured for at least one of recording and playback of data on an optical or magnetic disk.

Figure 2:
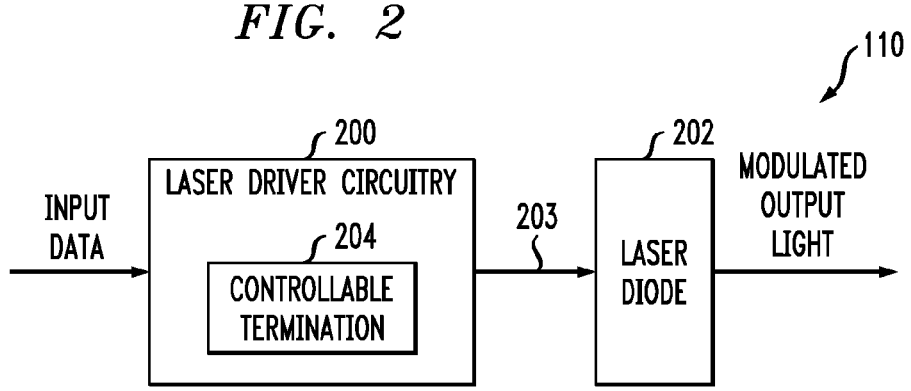
FIG. 2 shows a more detailed view of the laser of the FIG. 1 system.

FIG. 2 shows a more detailed view of the laser 110 in a write mode of operation of the optical disk recording and playback system 100. The laser 110 comprises laser driver circuitry 200 coupled to a laser diode 202 via a transmission line 203. The laser driver circuitry 200 is an example of what is more generally referred to herein as a "driver circuit" that is adapted for coupling to an optical source via at least one transmission line. The laser driver circuitry 200 comprises a controllable termination 204 which serves as a termination for the transmission line 203 used to couple the laser driver circuitry 200 to the laser diode 202. As will be described in greater detail below, the controllable termination 204 is switchable between at least first and second termination configurations, with the first termination configuration comprising, for example, an AC termination configuration and the second termination configuration comprising, for example, a DC termination configuration. The AC termination is generally matched to the transmission line 203 for a designated frequency range, while the DC termination generally provides a controlled impedance down to DC.

As indicated previously, in an arrangement of the type shown in FIG. 2, it is important to properly terminate the transmission line that couples the laser driver circuitry to the laser diode. Failure to provide an appropriate termination can lead to reflections or standing waves that cause signal loss or otherwise reduce signal quality, particularly at high data rates commonly used in optical recording and other applications. In embodiments of the invention, this termination is made controllable such that different termination configurations can be used depending upon operating mode or other factors. This helps to facilitate high speed operation, while providing a particularly efficient termination arrangement that takes up minimal circuit area and can be implemented at low cost.

Although shown as part of the laser 110 in the FIG. 2 embodiment, in other embodiments at least a portion of the laser driver circuitry 200 may be implemented outside of the laser, such as in a separate integrated circuit.

Figure 3:
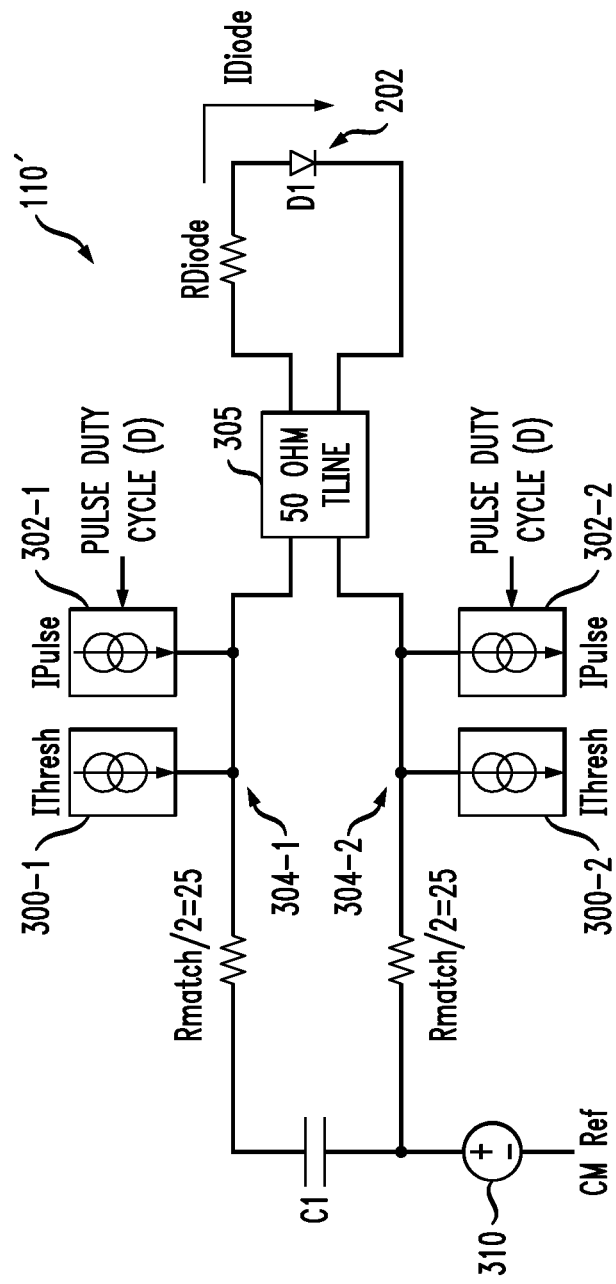
FIG. 3 illustrates a laser having a driver circuit with a fixed termination.

Referring now to FIG. 3, an implementation of laser 110 without a controllable termination is designated as laser 110'. The laser 110' includes laser diode 202, also denoted as D1 and having an associated series resistance Rdiode. The current through the laser diode D1 is denoted Idiode. The laser driver circuitry 200 in this embodiment comprises first and second current sources, each comprising a pair of threshold and pulse current sources providing respective threshold and pulse currents denoted IThresh and IPulse. More particularly, the first current source includes both a threshold current source 300-1 and a pulse current source 302-1, and the second current source includes both a threshold current source 300-2 and a pulse current source 302-2. The pulse current sources 302 are each driven by an input data signal, illustratively a pulse signal having duty cycle D.

The laser diode D1 is coupled between respective conductors of a 50 ohm transmission line 305, also referred to as a "Tline" in the figure. The transmission line 305 comprises a first or upper conductor coupled via a series resistance Rdiode to an anode of D1 and a second or lower conductor coupled to a cathode of D1. The diode D1 and its associated series resistance Rdiode are therefore coupled between the upper and lower conductors of the transmission line 305. The first current source comprising threshold current source 300-1 and pulse current source 302-1 drives the upper conductor of the transmission line 305, and the second current source comprising threshold current source 300-2 and pulse current source 302-2 drives the lower conductor of the transmission line 305. The threshold current sources 300 provide the off state current for the laser diode D1 and are DC current sources. The pulse current sources 302 cause the laser diode D1 to turn on and are pulsed on and off.

It should be noted that the current sources 300 and 302, the transmission line 305 and laser diode 202 may all be of conventional design, and accordingly will not be described in further detail herein.

Also coupled to the upper and lower conductors of the transmission line 305 are respective upper and lower portions 304-1 and 304-2 of a fixed termination for the transmission line 305. Each of the upper and lower portions 304 comprises a series matching resistor Rmatch/2 which in the present embodiment illustratively has a resistance value given by half the matching resistance of the 50 ohm transmission line, or 25 ohms. Other transmission line and matching resistor impedance values may be used in other embodiments. The upper matching resistor is coupled via a series capacitor C1 to a common mode (CM) reference voltage source 310. The lower matching resistor is coupled directly to the CM reference voltage source 310.

In the FIG. 3 embodiment, the 25 ohm matching resistors Rmatch/2 in combination with the capacitor C1 are configured to provide a high frequency AC termination for the transmission line 305.

As mentioned above, the FIG. 3 arrangement is not controllable between different termination configurations, but instead provides a fixed termination for the transmission line 305. However, we have determined that use of a fixed termination of this type can be problematic, particularly for high speed operation. For example, a suitable capacitance value for the capacitor C1 in the FIG. 3 arrangement may be on the order of about 50 picofarads (pF) for an operating frequency range around 1 gigahertz (GHz), and accordingly such a capacitor can require significant circuit area when fabricated in an integrated circuit. The use of a 50 pF capacitor value for C1 provides a sufficiently low impedance at the frequency range of interest, in this case about 3 ohms at 1 GHz. An even larger capacitor would be required if a lower impedance is needed or if the frequency range of interest is lower than 1 GHz.

Also, this termination arrangement is not fully differential as the lower terminal of the capacitor C1 is driven to a fixed DC potential while the upper terminal includes the impedance of the capacitor. In addition, this arrangement cannot be switched easily because the switch resistance would need to be very low, which in a metal-oxide-semiconductor (MOS) implementation would generally require the use of a large MOS device having a significant amount of additional capacitance.

Figure 4:
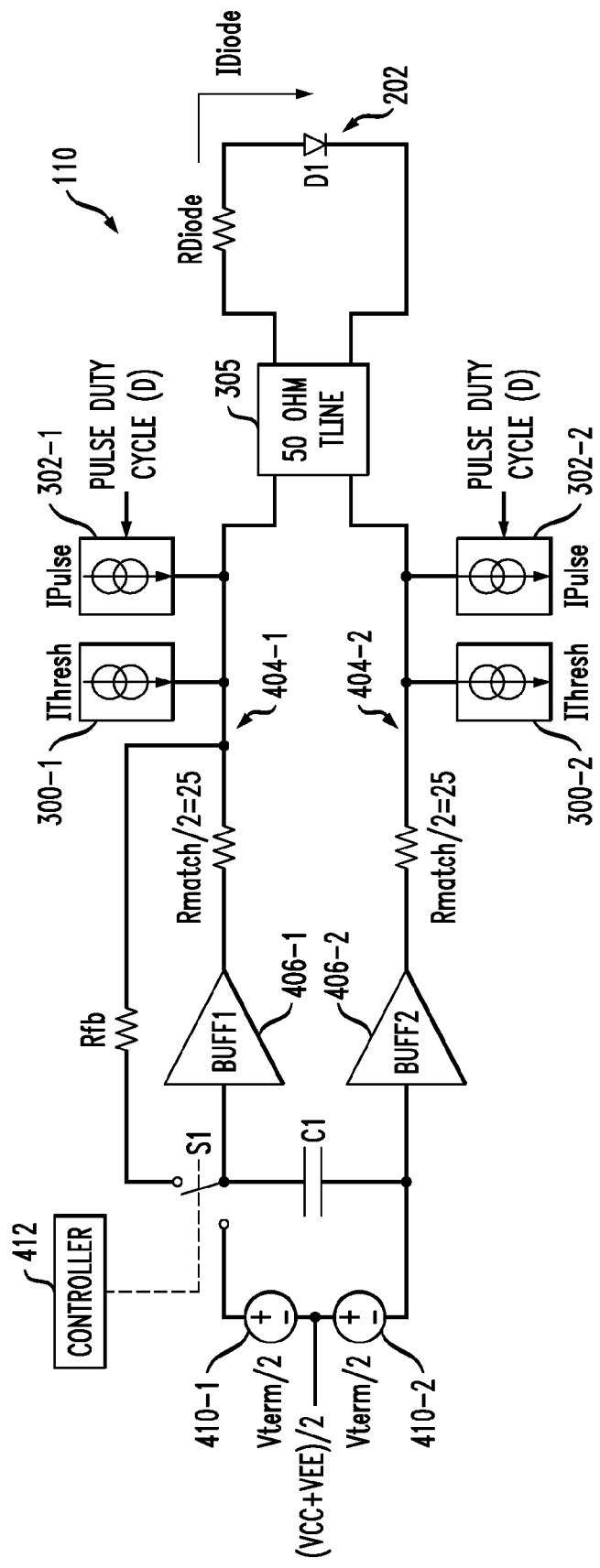
FIG. 4 illustrates one possible embodiment of the FIG. 2 laser having a driver circuit with a controllable termination.

The FIG. 4 embodiment of laser 110 incorporates controllable termination 204 as previously mentioned in conjunction with FIG. 2. The current sources 300 and 302, transmission line 305 and laser diode 202 are generally configured in the manner previously described in conjunction with FIG. 3. However, the controllable termination 204 in this embodiment comprises upper and lower portions 404-1 and 404-2 in place of respective upper and lower portions 304-1 and 304-2 of the fixed termination of FIG. 3.

The upper portion 404-1 of the controllable termination comprises a first buffer circuit 406-1 having an output coupled via an upper matching resistor Rmatch/2 to the upper conductor of the transmission line 305. Similarly, the lower portion 404-2 of the controllable termination comprises a second buffer circuit 406-2 having an output coupled via a lower matching resistor to the lower conductor of the transmission line 305. The inputs of the first and second buffer circuits 406 are coupled together via a capacitor C1 which in the present embodiment may have a capacitance value on the order of only about 3 pF. Other values substantially less than the 50 pF value of FIG. 3 may be used, including, for example, values less than about 10 pF, such that the capacitor C1 in the FIG. 4 embodiment can be fabricated using much less integrated circuit area than in the case of FIG. 3, given the same frequency range of interest.

The controllable termination 204 further comprises a switch S1 configured to couple an input of the first buffer circuit 406-1 to a feedback resistor Rfb in a first termination configuration and to a first termination voltage source 410-1 in a second termination configuration. As indicated previously, the first and second termination configurations in the present embodiment are respective AC and DC termination configurations, respectively. The feedback resistor Rfb, which may illustratively have a value on the order of about 1 kiloohm, is coupled between the input of the first buffer circuit 406-1 and the upper conductor of the transmission line 305 in the first termination configuration. The input of the second buffer circuit 406-2 is coupled to a second termination voltage source 410-2 in both the first and second termination configurations.

Accordingly, the controllable termination is provided in the FIG. 4 embodiment by, in the first termination configuration, controlling switch S1 to couple the input of the first buffer circuit 406-1 to the feedback resistor Rfb and to decouple the input of the first buffer circuit 406-1 from the first termination voltage source 410-1, and in the second termination configuration, controlling switch S1 to decouple the input of the first buffer circuit 406-1 from the feedback resistor Rfb and to couple the input of the first buffer circuit 406-1 to the first termination voltage source 410-1. The input of the second buffer circuit 406-2 remains coupled to the second termination voltage source 410-2 for both the first and second termination configurations, and its connection is not altered by the state of switch S1.

In the first termination configuration, first buffer circuit 406-1 in combination with feedback resistor Rfb and capacitor C1 provide a low pass filter and AC coupling to a termination voltage source. More particularly, the voltage on the upper conductor of the transmission line 305 is sampled and low-pass filtered using components Rfb and C1. This filtered voltage is then buffered in the first buffer circuit 406-1 and applied to the upper matching resistor. Such a configuration allows a large time constant to be achieved without the need for a large capacitor.

At frequencies lower than the RC filter frequency, the input and output of the buffer circuit 406-1 will follow one another. The impedance looking back into the two matching resistors is therefore very high. However, at frequencies higher than the RC filter frequency, the buffer circuit input is at AC ground and will not move and therefore the impedance looking back into the two matching resistors will be approximately Rmatch. The capacitor C1 can be much smaller than in the direct AC termination arrangement of FIG. 3 since feedback resistor Rfb can be made much larger than Rmatch to minimize circuit area. Also, because Rfb can be made large, the switch S1 for switching between the AC termination and the DC termination can be implemented using a very small MOS device.

The first and second termination voltage sources 410-1 and 410-2 provide respective voltages Vterm/2 above and below a common mode voltage supply node given approximately by (VCC+VEE)/2, where VCC and VEE denote respective upper and lower supply voltages of the laser driver circuitry 200. Thus, the common mode voltage supply is set to the center of the available supplies VCC and VEE. The voltage Vterm can be set to approximate the voltage drop across the laser diode D1.

The state of the switch 51 in the present embodiment is controlled responsive to an applied control signal from a controller 412. The controller 412 is therefore configured to control the termination 204 between its first and second configurations by application of the control signal to a control input of the switch 51. The controller 412 in other embodiments may be implemented at least in part outside of the laser 110 and optical module 102, such as within the processor 120, possibly using a programmable register that can be written with one or more data bits indicating the currently selected termination configuration. Numerous alternative switching and control signaling arrangements may be used to select between multiple available termination configurations in a given embodiment.

The controllable termination in the FIG. 4 embodiment provides an AC termination that requires a substantially smaller capacitance value than the fixed AC termination of the FIG. 3 embodiment, thereby facilitating high frequency implementations of the laser driver circuitry 200. Moreover, as noted above, the termination can be easily reconfigured into a DC termination configuration, responsive to a control signal.

The ability to switch easily between AC and DC termination configurations in the FIG. 4 embodiment can be particularly useful in a variety of different applications. In the DC termination configuration, the termination voltage source generally must be programmed or otherwise configured to match the voltage drop across laser diode D1, which can increase operating complexity. The AC termination configuration removes this requirement but an adverse effect of AC termination is that it may shift the threshold current applied to the laser diode D1 based on the pulse current amplitude and duty cycle. This is due to the fact the AC termination will typically charge C1 to the average value of the voltage across the laser diode and the diode series resistance Rdiode. This average voltage will increase as average pulse current increases. Accordingly, it can be beneficial in many situations to be able to easily switch between AC and DC termination configurations.

Again, it should be emphasized that the above-described embodiments of the invention are intended to be illustrative only. For example, other embodiments can use different types and arrangements of optical sources, driver circuits, controllable terminations and controller circuitry. Also, different types of AC and DC terminations may be used. The particular resistor and capacitor values, termination voltages and other driver circuit parameters and characteristics mentioned above in conjunction with the illustrative embodiments may be varied in other embodiments based on factors such as operating frequencies, signal levels, diode types, etc. These and numerous other alternative embodiments within the scope of the following claims will be apparent to those skilled in the art.

What is claimed is:

1. An apparatus comprising:
    a driver circuit adapted for coupling to an optical source via at least one transmission line;
    the driver circuit comprising a controllable termination for said transmission line;
    wherein the controllable termination is switchable between first and second termination configurations; and
    wherein the controllable termination comprises at least one buffer circuit having an output coupled to a conductor of the transmission line and an input switchably coupled to a termination voltage source.

2. The apparatus of claim 1 wherein the driver circuit comprises a laser driver circuit.

3. The apparatus of claim 1 wherein the optical source comprises a laser diode coupled between respective first and second conductors of the transmission line.

4. The apparatus of claim 1 wherein the transmission line comprises a first conductor coupled to a first terminal of the optical source and a second conductor coupled to a second terminal of the optical source.

5. The apparatus of claim 4 wherein the driver circuit further comprises:
    a first current source configured to drive the first conductor; and
    a second current source configured to drive the second conductor.

6. The apparatus of claim 5 wherein at least one of the first and second current sources comprises:
    a threshold current source; and
    a pulse current source;
    wherein the pulse current source is driven by an input data signal of the driver circuit.

7. The apparatus of claim 1 wherein the first termination configuration comprises an alternating current termination configuration and the second termination configuration comprises a direct current termination configuration.

8. The apparatus of claim 1 wherein the controllable termination comprises:
    a first buffer circuit having an output coupled via a first matching resistor to a first conductor of the transmission line;
    a second buffer circuit having an output coupled via a second matching resistor to a second conductor of the transmission line; and
    a switch configured to couple an input of one of the first and second buffer circuits to a feedback resistor in the first termination configuration and to a termination voltage source in the second termination configuration.

9. The apparatus of claim 8 wherein the inputs of the first and second buffer circuits are coupled together via a capacitor.

10. The apparatus of claim 9 wherein the capacitor has a capacitance value substantially less than 50 picofarads.

11. The apparatus of claim 8 wherein the feedback resistor is coupled between the input of the first buffer circuit and the first conductor of the transmission line in the first termination configuration.

12. The apparatus of claim 11 wherein the input of the second buffer circuit is coupled to a termination voltage source in both the first and second termination configurations.

13. A disk-based data storage system comprising the apparatus of claim 1.

14. The disk-based data storage system of claim 13 wherein the system comprises an optical disk system configured for at least one of recording and playback of data on an optical disk.

15. The disk-based storage system of claim 13 wherein the system comprises a heat-assisted magnetic recording system configured for recording of data on a magnetic disk.

16. An optical communication system comprising the apparatus of claim 1.

17. A method comprising:
providing a controllable termination for a transmission line coupling a driver circuit to an optical source; and
switching the controllable termination between at least first and second termination configurations;
wherein the controllable termination comprises at least one buffer circuit having an output coupled to a conductor of the transmission line and an input switchably coupled to a termination voltage source; and
wherein switching the controllable termination comprises one of coupling an input of the at least one buffer circuit to and decoupling an input of the at least one buffer circuit from the termination voltage source.

18. The method of claim 17 wherein the switching step comprises switching the controllable termination between an alternating current termination configuration and a direct current termination configuration.

19. The method of claim 17 wherein the controllable termination comprises a first buffer circuit having an output coupled via a first matching resistor to a first conductor of the transmission line and a second buffer circuit having an output coupled via a second matching resistor to a second conductor of the transmission line, and wherein the switching step comprises:

in the first termination configuration, coupling an input of the first buffer circuit to a feedback resistor and decoupling the input of the first buffer circuit from a first termination voltage source;
in the second termination configuration, decoupling the input of the first buffer circuit from the feedback resistor and coupling the input of the first buffer circuit to the first termination voltage source;
wherein an input of the second buffer circuit is coupled to a second termination voltage source in both the first and second termination configurations.

20. A computer-readable storage medium having embodied therein executable code for performing the steps of the method of claim 17.

21. An apparatus comprising:
an integrated circuit comprising at least one driver circuit adapted for coupling to an optical source via at least one transmission line;
the driver circuit comprising a controllable termination for said transmission line;
wherein the controllable termination is switchable between first and second termination configurations;
wherein the controllable termination comprises at least one buffer circuit having an output coupled to a conductor of the transmission line and an input switchably coupled to a termination voltage source.

22. The apparatus of claim 1 wherein the input of the buffer circuit is coupled to a feedback resistor in the first termination configuration and to the termination voltage source in the second termination configuration.

* * * * *